(12) United States Patent
Harada et al.

(10) Patent No.: US 10,727,145 B2
(45) Date of Patent: Jul. 28, 2020

(54) SEMICONDUCTER DEVICE WITH FILLER TO SUPPRESS GENERATION OF AIR BUBBLES AND ELECTRIC POWER CONVERTER

(71) Applicant: MITSUBISHI ELECTRIC CORPORATION, Chiyoda-ku (JP)

(72) Inventors: Hiroyuki Harada, Chiyoda-ku (JP); Kozo Harada, Chiyoda-ku (JP); Hiroki Shiota, Chiyoda-ku (JP); Yoshihiro Yamaguchi, Chiyoda-ku (JP); Koji Yamada, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/323,021

(22) PCT Filed: Sep. 20, 2017

(86) PCT No.: PCT/JP2017/033823
§ 371 (c)(1),
(2) Date: Feb. 4, 2019

(87) PCT Pub. No.: WO2018/056287
PCT Pub. Date: Mar. 29, 2018

(65) Prior Publication Data
US 2019/0206751 A1 Jul. 4, 2019

(30) Foreign Application Priority Data
Sep. 21, 2016 (JP) ................................. 2016-184061

(51) Int. Cl.
*H01L 23/24* (2006.01)
*H01L 23/373* (2006.01)
(Continued)

(52) U.S. Cl.
CPC .............. *H01L 23/24* (2013.01); *H01L 23/04* (2013.01); *H01L 23/049* (2013.01); *H01L 23/10* (2013.01);
(Continued)

(58) Field of Classification Search
CPC ..... H01L 23/24; H01L 23/28; H01L 23/3135; H01L 2924/181; H01L 23/10; H01L 2924/18161
See application file for complete search history.

(56) References Cited

U.S. PATENT DOCUMENTS

| 5,068,267 A | 11/1991 | Uchida et al. |
| 2007/0246833 A1* | 10/2007 | Soga ........................ H01L 23/24 257/772 |
| 2017/0025344 A1* | 1/2017 | Kanai ............... H01L 23/49894 |

FOREIGN PATENT DOCUMENTS

| JP | 62-11004 | 3/1987 |
| JP | 2-84458 A | 3/1990 |

(Continued)

OTHER PUBLICATIONS

International Search Report dated Nov. 28, 2017 in PCT/JP2017/033823 filed Sep. 20, 2017.
(Continued)

*Primary Examiner* — Quoc D Hoang
(74) *Attorney, Agent, or Firm* — Xsensus LLP

(57) ABSTRACT

A semiconductor device including: an insulating substrate having a conductor layer on the upper face and the lower face and a semiconductor element mounted on the upper conductor layer; a base plate bonded to the lower conductor layer; a case member surrounding the insulating substrate and bonded to the surface of the base plate to which the conductor layer bonded to the lower face; a first filler being a silicone composition filled in a region surrounded by the base plate and the case member; and a second filler being
(Continued)

injected into a region below the first filler and surrounding a peripheral edge portion of the insulating substrate, whose height from the base plate is higher than the upper face and is lower than a bonding face between the semiconductor element and the upper conductor layer.

20 Claims, 8 Drawing Sheets

(51) Int. Cl.
    *H01L 23/00*     (2006.01)
    *H01L 25/07*     (2006.01)
    *H02M 7/5387*     (2007.01)
    *H01L 23/049*     (2006.01)
    *H01L 23/31*     (2006.01)
    *H01L 23/10*     (2006.01)
    *H01L 25/18*     (2006.01)
    *H01L 23/28*     (2006.01)
    *H01L 23/29*     (2006.01)
    *H01L 23/04*     (2006.01)
    *H02P 27/08*     (2006.01)

(52) U.S. Cl.
CPC .............. *H01L 23/28* (2013.01); *H01L 23/29* (2013.01); *H01L 23/31* (2013.01); *H01L 23/3735* (2013.01); *H01L 23/562* (2013.01); *H01L 24/73* (2013.01); *H01L 25/07* (2013.01); *H01L 25/072* (2013.01); *H01L 25/18* (2013.01); *H02M 7/53871* (2013.01); *H01L 24/29* (2013.01); *H01L 24/32* (2013.01); *H01L 24/45* (2013.01); *H01L 24/48* (2013.01); *H01L 24/49* (2013.01); *H01L 2224/29101* (2013.01); *H01L 2224/32225* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/48137* (2013.01); *H01L 2224/48227* (2013.01); *H01L 2224/48247* (2013.01); *H01L 2224/48472* (2013.01); *H01L 2224/49109* (2013.01); *H01L 2224/73265* (2013.01); *H01L 2224/85205* (2013.01); *H01L 2224/85801* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/14252* (2013.01); *H01L 2924/16195* (2013.01); *H01L 2924/181* (2013.01); *H01L 2924/19107* (2013.01); *H01L 2924/3512* (2013.01); *H01L 2924/3641* (2013.01); *H02P 27/08* (2013.01)

(56) References Cited

FOREIGN PATENT DOCUMENTS

| | | |
|---|---|---|
| JP | 7-58282 A | 3/1995 |
| JP | 8-125071 A | 5/1996 |
| JP | 11-87567 A | 3/1999 |
| JP | 2001-244386 A | 9/2001 |
| JP | 2002-241581 A | 8/2002 |
| JP | 2012-151342 A | 8/2012 |
| JP | 2014-130875 A | 7/2014 |

OTHER PUBLICATIONS

Office Action dated Dec. 10, 2019 in Japanese Patent Application No. 2018-541082 (with unedited computer generated English translation), 10 pages.

* cited by examiner

SEMICONDUCTER DEVICE WITH FILLER TO SUPPRESS GENERATION OF AIR BUBBLES AND ELECTRIC POWER CONVERTER

TECHNICAL FIELD

The present invention relates to a filling structure of a semiconductor device in which a power semiconductor element is sealed with a filler, and to an electric power converter using the semiconductor device.

BACKGROUND ART

A semiconductor element of a type in which an energization path is formed in a vertical direction of the element for the purpose of coping with a high voltage and a large current is generally called a power semiconductor element (for example, an insulated gate bipolar transistor (IGBT), a metal oxide semiconductor field effect transistor (MOSFET), a bipolar transistor, or a diode). A semiconductor device in which the power semiconductor element is mounted on a circuit board and packaged with a filler is used in various fields, such as industrial equipment, vehicles, and railways. In recent years, along with increase in performance of equipment having the semiconductor device mounted thereon, there is more demand for increase in performance of the semiconductor device, such as increase in rated voltage and rated current or enlargement of a usage temperature range (to higher temperature or lower temperature).

A mainstream packaging structure of the semiconductor device is called a case-type packaging structure. The semiconductor device using the case-type packaging structure has the following structure. The power semiconductor element is mounted on a heat-radiating base plate through the intermediation of an insulating circuit board. The insulating circuit board includes a front-face electrode pattern on one face of an insulating substrate, and a back-face electrode pattern on another face of the insulating substrate. A case is caused to adhere to the base plate. Further, the semiconductor element mounted in the semiconductor device is connected to main electrodes. Bonding wires are used for the connection between the semiconductor element and the main electrodes. For the purpose of preventing insulation failure that occurs when a high voltage is applied, in general, an insulating gel-like filler as typified by a silicone gel is used as the filler of the semiconductor device.

In general, the amount of gas that can be dissolved in the silicone gel is decreased as the temperature is increased. Therefore, when the usage temperature range of the semiconductor device is enlarged and the silicone gel is used at higher temperature, the gas that has become insoluble in the silicone gel forms air bubbles. In a portion in which such air bubbles are generated, the insulation filling effect by the silicone gel cannot be obtained, and hence the insulation performance of the semiconductor device is degraded.

Further, the semiconductor device incorporates many members such as a semiconductor element, a bonding material, and a wire. Even when degassing processing is performed when the silicone gel is injected, there is a risk that air bubbles may be generated in the semiconductor device.

Further, those air bubbles in the silicone gel are assumed to be increased in size due to influences of external environments such as moisture absorption and heating.

As a countermeasure fora case in which air bubbles are generated in the silicone gel as described above or a case in which the silicone gel is separated from various members, it is conceivable to inject a rubber material in which air bubbles cannot be generated or grown into the material when the semiconductor device is used. The rubber material is injected into a narrow gap space between a surface portion at which a ceramic substrate of the insulating circuit board, for which an insulation property is required to be secured, is exposed and the base plate to which the insulating circuit board is bonded.

As a related-art semiconductor device, there is disclosed a semiconductor device having a structure in which a peripheral edge portion of the insulating circuit board is covered with a silicone rubber adhesive, which has a strong adhesive property with respect to the insulating substrate and a container bottom face, and then a filler is injected (for example, Patent Literature 1).

CITATION LIST

Patent Literature

[PTL 1] JP 8-125071 A (page 4, FIG. 1)

SUMMARY OF INVENTION

Technical Problem

However, in the semiconductor device described in Patent Literature 1, the peripheral edge portion of the insulating circuit board is covered with an adhesive material, and hence, when the exposed part of the ceramic substrate of the insulating circuit board, that is, a creepage distance is large, a narrow gap is formed between the base plate and a surface portion on the back face side of the exposed part of the ceramic substrate. It is difficult to inject an adhesive having high viscosity into this narrow gap region. Air bubbles may be generated when an adhesive having high viscosity is injected, and thus insulation reliability is degraded in some cases.

The present invention has been made to solve the above-mentioned problems.

Solution to Problem

According to one embodiment of the present invention, there is provided a semiconductor device including: an insulating substrate having a conductor layer formed on each of an upper face and a lower face of the insulating substrate, the conductor layer on the upper face having a semiconductor element mounted thereon; a base plate bonded to the conductor layer on the lower face; a case member surrounding the insulating substrate and adhering to a face of the base plate to which the conductor layer on the lower face is bonded; a first filler being a silicone composition injected into a region surrounded by the base plate and the case member; and a second filler being a silicone composition that is harder than the first filler, the second filler surrounding a peripheral edge portion of the insulating substrate below the first filler in the region, the second filler being injected into a region in which a height from the base plate is higher than the upper face and is lower than a bonding face between the semiconductor element and the conductor layer on the upper face.

Advantageous Effects of Invention

According to one embodiment of the present invention, in the semiconductor device having a narrow gap, generation of air bubbles can be suppressed, and thus insulation reliability can be improved.

DESCRIPTION OF EMBODIMENTS

First Embodiment

Figure 1:
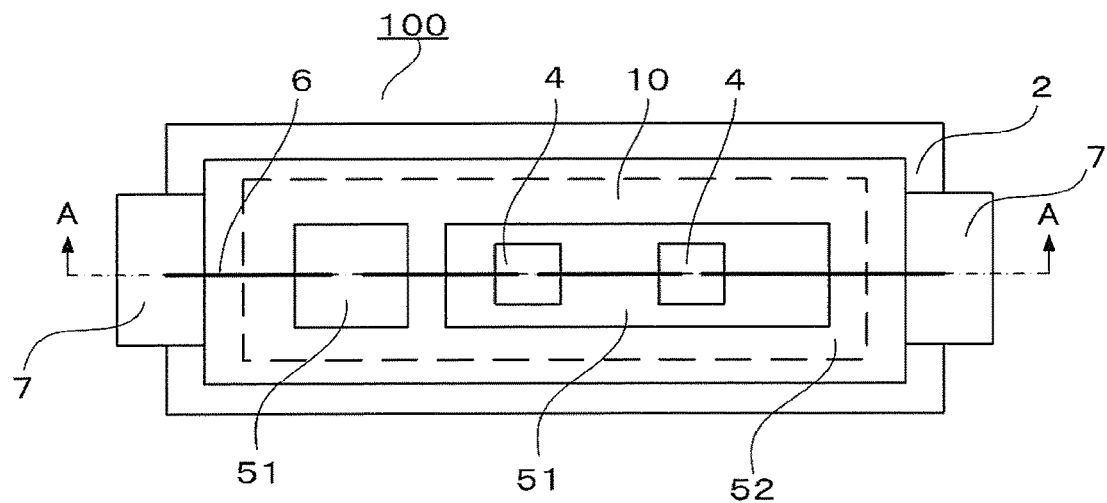
FIG. 1 is a schematic top structure view for illustrating a semiconductor device according to a first embodiment of the present invention.
Figure 2:
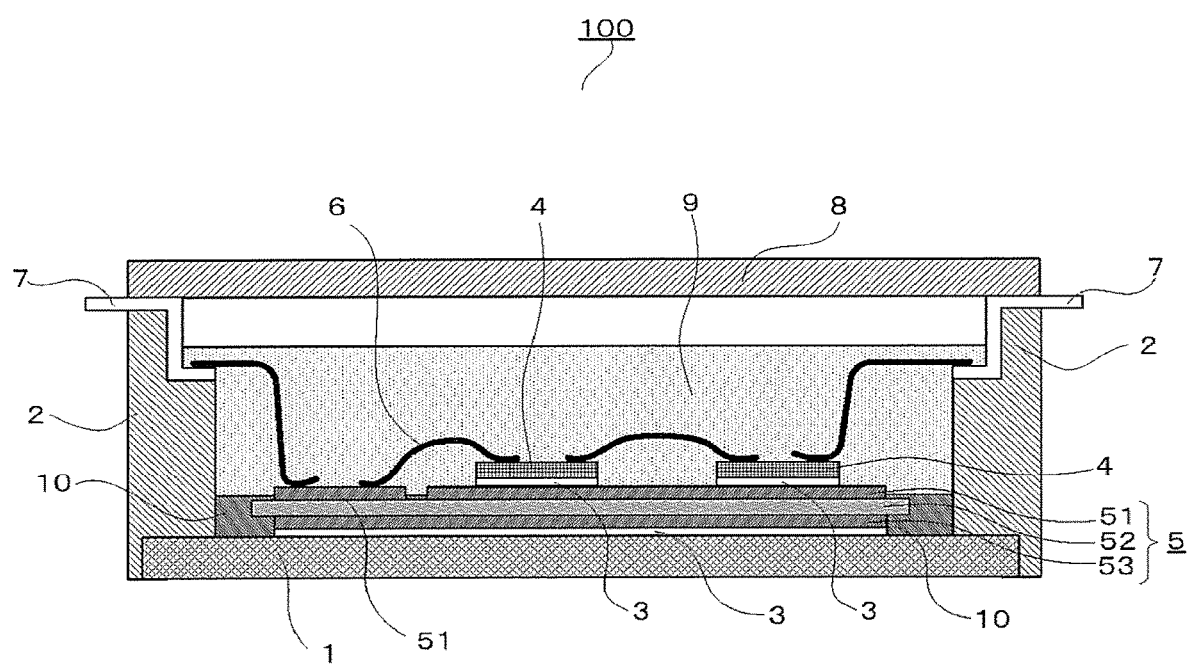
FIG. 2 is a schematic sectional structure view for illustrating the semiconductor device according to the first embodiment of the present invention.

FIG. 1 is a schematic top structure view for illustrating a semiconductor device according to a first embodiment of the present invention. FIG. 2 is a schematic sectional structure view for illustrating the semiconductor device according to the first embodiment of the present invention. FIG. 1 is a view for illustrating a semiconductor device 100 as viewed from the top through a first filler 9 being a silicone composition. A peripheral edge portion (outer peripheral portion) of an insulating substrate 52, which is covered with a second filler 10, is indicated by the dotted line.

FIG. 2 is a schematic sectional structure view taken along the dash-dotted line A-A of FIG. 1. In FIG. 2, the semiconductor device 100 includes a base plate 1, a case member 2, solder 3 serving as a bonding material, semiconductor elements 4, an insulating circuit board 5, bonding wires 6 serving as wiring members, electrode terminals 7, a lid member 8, the first filler 9 being a silicone composition, the second filler 10 being a silicone composition, electrode patterns 51 and 53 serving as conductor layers, and the insulating substrate 52.

The insulating circuit board 5 includes the insulating substrate 52, the electrode pattern 51 formed on an upper face (front face) side of the insulating substrate 52, and the electrode pattern 53 formed on a lower face (back face) side of the insulating substrate 52. On the electrode pattern 51 formed on the upper face side of the insulating substrate 52, the semiconductor elements 4 are electrically bonded via the solder or other bonding materials 3. In this case, for example, as the semiconductor element 4, a power control semiconductor element (switching element) such as a MOSFET, which is configured to control a large current, or a diode for free-wheeling (free-wheeling diode) is used.

Further, in the insulating circuit board 5, the electrode pattern 53 formed on the lower face side of the insulating substrate 52 is fixed to the base plate 1 via the solder or other bonding materials 3. Further, the base plate 1 serves as a bottom plate of the semiconductor device 100 so as to form a region (hereinafter referred to as "case") surrounded by the base plate 1 and the case member 2 arranged at the periphery of the base plate 1.

For the purpose of securing an insulation property inside the region surrounded by the case member 2 of the semiconductor device 100, the first filler 9 being a silicone composition and the second filler 10 being a silicone composition are injected into the case. The first filler 9 being a silicone composition is, for example, a silicone gel, and is injected up to a height that allows the semiconductor elements 4 and the bonding wires 6 to be sealed with the silicone gel.

Further, the second filler 10 being a silicone composition injected below the silicone gel 9 in the case is, for example, silicone rubber, and is injected so as to surround a peripheral edge portion of the insulating substrate 52. The silicone rubber 10 is injected up to a filling height position that is higher than an upper face of the insulating substrate 52 from a front face of the base plate 1, and is lower than a bonding face between the semiconductor element 4 and the solder 3, that is, a mounting face (mounting portion) of the semiconductor element 4, which is an upper face of the electrode pattern 51 formed on the upper face side of the insulating substrate 52.

At this time, the silicone rubber 10 surrounds the peripheral edge portion of the insulating substrate 52, and fills (encapsulates) an exposed part of the insulating substrate 52. The silicone rubber 10 is injected up to the same height in a space between the plurality of electrode patterns 51 formed on the upper face of the insulating substrate 52.

Further, the silicone gel 9 is injected onto the silicone rubber 10 so that the case is filled with the filler.

To the semiconductor element 4, the bonding wire 6 or other wiring for electrically connecting an electrode of the semiconductor element 4 to the outside is connected. Further, the bonding wire 6 is connected to the electrode terminal 7 so as to be electrically connected to the outside of the case. The electrode terminal 7 is insert-molded or outsert-molded to the case member 2.

The lid member 8 is arranged on an upper portion side of the case member 2 (opposite side of a side in contact with the base plate 1). With the lid member 8, the inside and the outside of the semiconductor device 100 are separated from each other so that powder dust or the like is prevented from entering the inside of the semiconductor device 100. The lid member 8 is fixed to the case member 2 with an adhesive (not shown) or screws (not shown).

Details of the components are described below.

As the semiconductor element 4, when a semiconductor element using a semiconductor material that operates at 150° C. or more is employed, an effect of suppressing generation of air bubbles is large. In particular, a large effect can be obtained when there is employed a so-called wide bandgap semiconductor, which is formed of a material such as silicon carbide (SiC), a gallium nitride (GaN) based material, or diamond (C) to have a wider bandgap than that of silicon (Si).

Further, in FIG. 2, as an example, only two semiconductor elements 4 are mounted in one filled semiconductor device 100, but the number of semiconductor elements 4 is not limited thereto. A required number of semiconductor elements 4 can be mounted depending on the application to be used.

The solder 3 is used as the bonding material, but the bonding material is not limited thereto. The semiconductor element 4 and the electrode pattern 51, or the electrode pattern 53 and the base plate 1 may be bonded to each other with use of silver or a silver alloy.

In general, copper is used for the electrode pattern 51 (front face), the electrode pattern 53 (back face), the base plate 1, and the electrode terminals 7, but the material for those components is not limited thereto. It is only required that the material have required heat radiation characteristics. For example, aluminum, iron, or a composite material of those materials may be used. Further, copper/invar/copper or other composite materials may be used, or AlSiC, CuMo, or other alloys may be used.

Further, in general, nickel plating is performed on the faces of the electrode pattern 51 (front face), the electrode pattern 53 (back face), the base plate 1, and the electrode terminal 7, but the present invention is not limited thereto. Gold or tin plating may be performed. It is only required to obtain a structure capable of supplying required current and voltage to the semiconductor element 4.

Further, at least parts of the electrode terminal 7 and the electrode pattern 51 are embedded in the silicone gel 9, and hence fine unevenness may be formed on the faces of the electrode terminal 7 and the electrode pattern 51 in order to improve the adhesiveness between the silicone gel 9 and the electrode terminal 7 and between the silicone gel 9 and the electrode pattern 51. With this unevenness, the adhesiveness between the silicone gel 9 and the electrode terminal 7 and between the silicone gel 9 and the electrode pattern 51 can be improved.

The insulating circuit board 5 is obtained by forming the electrode patterns 51 and 53 made of copper or aluminum on both faces of the insulating substrate 52 made of ceramics such as $Al_2O_3$, $SiO_2$, AlN, BN, and $Si_3N_4$. The insulating circuit board 5 is required to have a heat radiation property and an insulation property, and may be made of materials other than the above-mentioned materials. The electrode patterns 51 and 53 may be formed on the insulating substrate 52 being, for example, a resin cured product in which ceramic powder is dispersed or a resin cured product in which a ceramic plate is embedded.

Further, when the insulating substrate 52 is a resin cured product in which ceramic powder is dispersed, the ceramic powder used for the insulating substrate 52 is $Al_2O_3$, $SiO_2$, AlN, BN, $Si_3N_4$, or the like, but the powder is not limited thereto. Diamond, SiC, $B_2O_3$, or the like may be used. Further, powder made of a silicone resin, an acrylic resin, or other resins may be used.

The powder to be used often has a sphere shape, but the shape is not limited thereto. Powder having a milled shape, a granular shape, or a flake shape, or powder being an aggregate may be used. As a powder adding amount, an amount of powder with which a required heat radiation property and a required insulation property can be obtained may be added. As the resin to be used for the insulating substrate 52, in general, an epoxy resin is used, but the resin is not limited thereto. A polyimide resin, a silicone resin, an acrylic resin, or other resins may be used. Any material can be used as long as the material has both of an insulation property and an adhesive property.

As the bonding wire 6, a wire member having a circular cross section and being made of aluminum or gold is used, but the bonding wire 6 is not limited thereto. For example, a member obtained by forming a copper plate having a square cross section into a band shape (ribbon) may be used. The material of the bonding wire 6 may be an aluminum alloy.

As illustrated in FIG. 2, in the first embodiment, four bonding wires 6 are used to establish connections between the semiconductor elements 4, between the semiconductor element 4 and the electrode terminal 7, between the semiconductor element 4 and the electrode pattern 51, and between the electrode pattern 51 and the electrode terminal 7, but the present invention is not limited thereto. A required number of bonding wires 6 having required thicknesses (sizes) may be provided depending on, for example, a current density of the semiconductor element 4.

Further, as a method and structure for bonding the bonding wire 6 and a bonded portion, melted metal bonding in which a metal piece of copper, tin, or the like is melted, ultrasonic bonding, or other methods can be used. However, the method and the structure are not particularly limited as long as required current and voltage can be supplied to the semiconductor element 4.

The case member 2 is preferred to be made of a resin material having a high thermal softening point, and is made of, for example, a polyphenylene sulfide (PPS) resin. However, the material is not particularly limited as long as the material has an insulation property and does not thermally deform within a usage temperature range of the semiconductor device 100.

As the first filler, for example, the silicone gel 9 is used, but the first filler is not limited thereto. Any material can be used as long as the material has a desired elastic modulus and a desired heat resistance. For example, a urethane resin having both of an insulation property and an adhesive property may be used.

As the hardness of the silicone gel 9 being the first filler, when a hard silicone gel 9 having a penetration of 20 or less is used, the bonding wire 6 may be damaged due to expansion and contraction of the silicone gel 9 at the time of a heat cycle test of the semiconductor device 100. Therefore, the hardness is desired to be 20 or more in penetration. In contrast, when a soft silicone gel 9 having a penetration of 100 or more is used, the silicone gel 9 itself is damaged due to expansion and contraction of the silicone gel 9 at the time of the heat cycle test of the semiconductor device 100. Therefore, the hardness is desired to be 100 or less in penetration. As a result, in order to secure reliability of the semiconductor device 100, the silicone gel 9 is desired to have hardness in a range of 20 or more and 100 or less in penetration.

Figure 3:
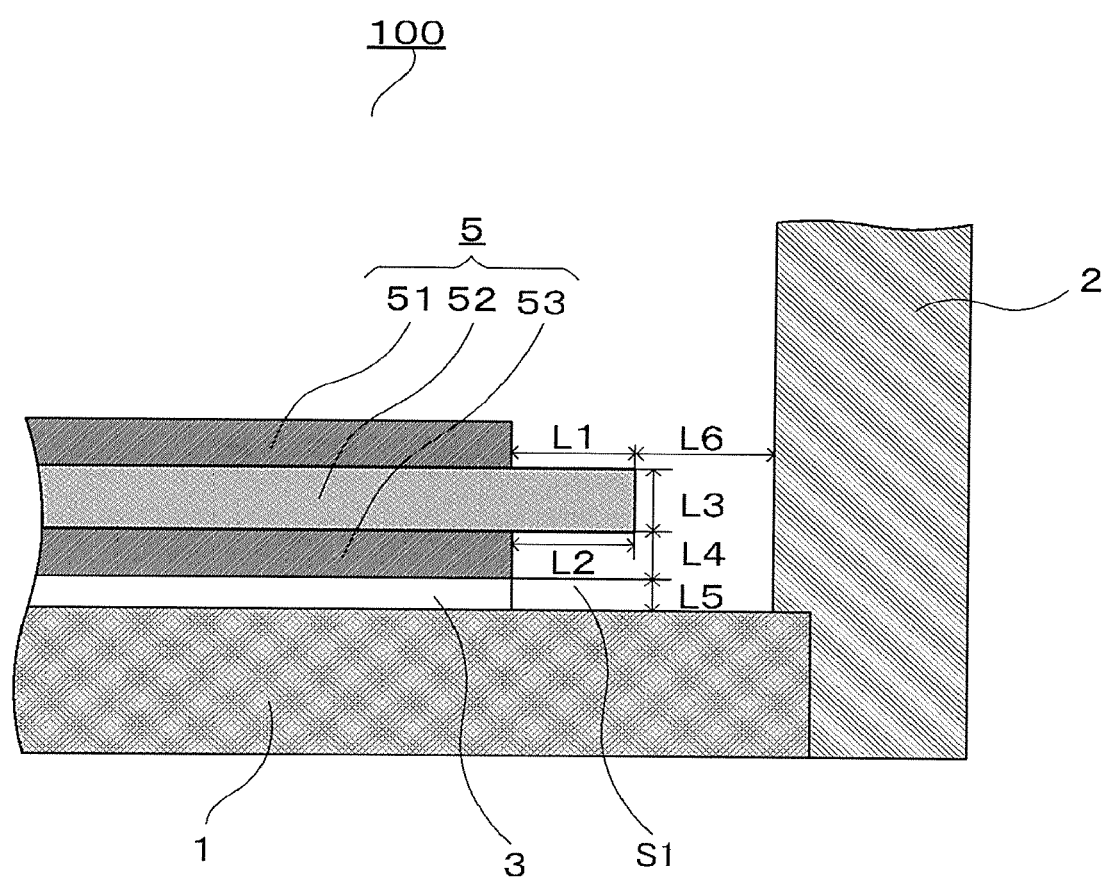
FIG. 3 is a schematic sectional structure view for illustrating an end portion of an insulating circuit board excluding a filler in the semiconductor device according to the first embodiment of the present invention.

FIG. 3 is a schematic sectional structure view for illustrating an end portion of the insulating circuit board of the semiconductor device excluding the filler in the first embodiment of the present invention. In FIG. 3, the insulating circuit board 5 includes the insulating substrate 52, the electrode pattern 51 formed on the upper face side of the insulating substrate 52, and the electrode pattern 53 formed on the lower face side of the insulating substrate 52. To the upper face of the electrode pattern 51, the semiconductor element 4 is bonded via the solder 3 or other bonding materials (not shown, see FIG. 1 and FIG. 2). The lower face of the electrode pattern 53 is bonded to the base plate 1 with the solder 3 or other bonding materials.

In order for the semiconductor device 100 to maintain (secure) a required dielectric breakdown voltage, on the upper face side of the insulating substrate 52, the electrode pattern 51 is formed with a margin portion (surface portion) being left at the outer periphery of the insulating substrate 52. Further, on the lower face side of the insulating substrate 52, the electrode pattern 53 is formed with a margin portion (surface portion) being left at the outer periphery of the insulating substrate 52.

The surface portions on the upper face side and the lower face side of the insulating substrate 52 are formed so as to secure the insulation property between the electrode pattern 51 and the electrode pattern 53 of the insulating circuit board 5. Along with increase in breakdown voltage of the semiconductor device 100, the creepage distance and the thickness of the insulating substrate 52 are required to be increased. The surface portion herein refers to an outer peripheral portion region of the insulating substrate 52 in which the electrode patterns 51 and 53 are not formed.

A length of the surface portion on the upper face side of the insulating substrate 52 is represented by L1, a length of the surface portion on the lower face side of the insulating substrate 52 is represented by L2, a length of a side surface of the insulating substrate 52, that is, a thickness of the insulating substrate 52 is represented by L3, a thickness of the electrode pattern 53 is represented by L4, a thickness of the solder 3 is represented by L5, and a length from the end portion of the insulating substrate 52 to the case member 2 is represented by L6. In this case, as a path in which dielectric breakdown occurs in the semiconductor device 100, an insulation distance of L1+L3+L4+L5 or an insulation distance of L1+L3+L2 is conceivable.

The dielectric breakdown occurs in a dominant manner in any path having a shorter distance. Therefore, the lengths of L1, L2, L3, L4, and L5 are only required to be set so that the semiconductor device 100 can secure an insulation distance satisfying the dielectric breakdown voltage. Further, L6 is generally a distance of 2 mm or more in consideration of misalignment at the time of bonding between the insulating circuit board 5 and the base plate 1. In a case where L6 is 2 mm or less, when the insulating circuit board 5 is arranged on the base plate 1, the insulating circuit board 5 cannot be arranged at a predetermined position due to a shift during alignment. When L6 is 10 mm or more, a ratio of the silicone rubber 10 occupied in the case is increased, which causes occurrence of stress. Thus, the silicone rubber 10 may be separated from the base plate 1. For those reasons, the dimension of L6 is set in a range of 2 mm or more and 10 mm or less so that a semiconductor device having secured insulation reliability can be configured.

In a general semiconductor device, in general, a space S1 between the surface portion on the lower face side of the insulating substrate 52 and a surface on the upper side of the base plate 1 on which the insulating circuit board 5 is mounted is filled with the silicone gel 9. The electrode patterns 51 and 53 are generally bonded to the insulating substrate 52 with a brazing filler metal. At a brazing filler metal portion at an interface between the electrode pattern 51 or 53 and the insulating substrate 52 or at a bonding material interface at which the electrode pattern 53 and the base plate 1 are bonded with the bonding material 3, an unfilled part in which the silicone gel 9 is not fully injected is liable to occur.

Further, even when degassing processing is performed at the time when the silicone gel 9 is injected, at the surface portion on the lower face side of the insulating circuit board 5, air bubbles formed in the space S1 may not be fully removed from the inside of the space S1 to the outside of the space 51 because the surface portion of the insulating substrate 52 serves as an eave. Thus, the air bubbles are liable to remain as voids when the silicone gel 9 is cured. The voids remaining in the silicone gel 9 are expanded and contracted along with the heat cycle of the silicone gel 9. Further, when the voids adsorb water and then are heated at high temperature due to a high-temperature operation of the semiconductor device, the adsorbed water is vaporized, and hence enlargement of the air bubbles is promoted in the silicone gel 9.

A diameter of the enlarged air bubble in the silicone gel 9 is represented by R1. In this case, the air bubble reduces the insulation distance, and hence, when an air bubble is generated in the silicone gel 9 present in the space S1, each of the insulation distance L1+L3+L4+L5 and the insulation distance L1+L3+L2, which has originally been responsible for the insulation property, is decreased by the amount of the air-bubble size R1. Thus, the effective insulation distance becomes the insulation distance L1+L3+L4+L5−R1 and the insulation distance L1+L3+L2−R1. The insulation distance is reduced by the amount of the diameter of the air bubble, and thus the insulation performance of the semiconductor device is degraded.

The degradation of the insulation performance of the semiconductor device is caused not only by the air bubbles generated only in the space S1 on the lower face side of the insulating substrate 52. The degradation of the insulation performance is similarly caused by air bubbles initially generated on the upper face side of the insulating substrate 52, in the vicinity of the case member 2, and in the vicinity of the semiconductor element 4 when the air bubbles reach the surface portion of the insulating circuit board 5.

Figure 4:
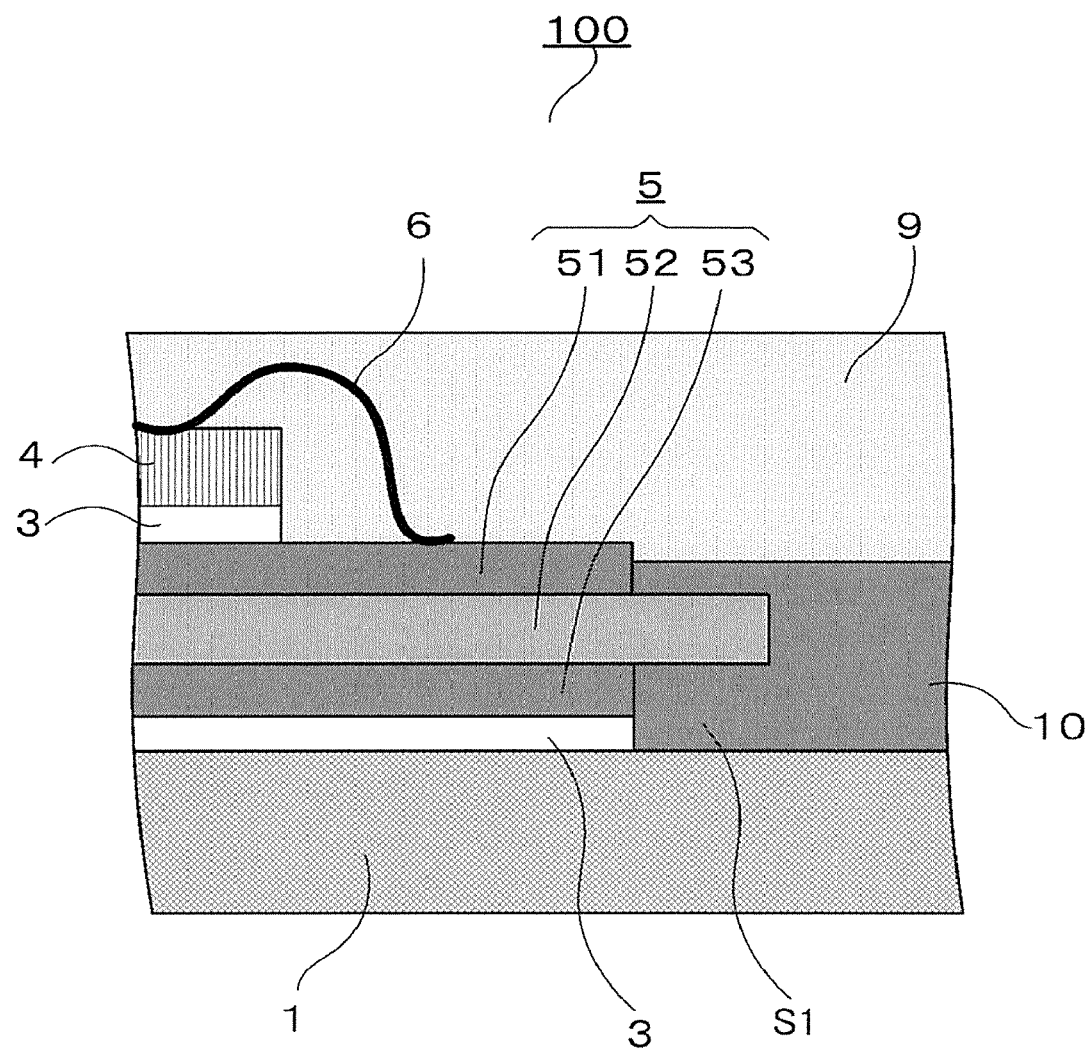
FIG. 4 is a schematic sectional structure view for illustrating a filling state at the end portion of the insulating circuit board in the semiconductor device according to the first embodiment of the present invention.

FIG. 4 is a schematic sectional structure view for illustrating a filling state at the end portion of the insulating circuit board in the semiconductor device according to the first embodiment of the present invention. The space S1 below the insulating substrate 52 is filled not with the silicone gel 9 but with the silicone rubber 10 so that generation of air bubbles, which have been generated in the silicone gel 9, can be suppressed. When only the silicone gel 9 is used, the hardness as the filler is low, and hence the air bubbles are enlarged with high possibility due to, for example, increase in internal pressure of the air bubbles in the filler material. In contrast, when the silicone rubber 10 is used, the hardness as the filler is high, and hence generation of the air bubbles can be suppressed.

Further, the silicone rubber 10 has, as compared to the silicone gel 9, a higher adhesive property with respect to various members such as the insulating substrate 52 and the base plate 1 and lower transmittance of gas and moisture. Therefore, the insulation reliability can be enhanced in the space 51, for which the insulation property is required.

Further, even when air bubbles are generated and enlarged in the silicone gel 9 arranged above the silicone rubber 10, entrance of the air bubbles into the region of the space S1 filled with the silicone rubber 10 can be suppressed. In this manner, degradation of the insulation reliability due to generation of air bubbles in the silicone gel 9 can be suppressed.

Regarding the filling amount of the silicone rubber 10, the bonding wire 6 is bonded on the electrode pattern 51 formed on the upper face side of the insulating substrate 52, and hence, when the bonding wire 6 is covered with a filler material having high hardness, there is a risk of damaging of the bonding wire 6 along with the heat cycle test of the semiconductor device 100. Therefore, the filling height from the base plate 1 of the silicone rubber 10 is desired to be lower than the front face being the mounting face of the electrode pattern 51, on which the semiconductor element 4 is mounted, and at least the space S1 requiring the dielectric breakdown voltage is required to be entirely filled with the silicone rubber 10. It is desired to cover a region represented by the dimensions L1, L2, and L3, which corresponds to a surface portion of the insulating substrate 52 that may be a starting point of generation of air bubbles and is present at a bonding interface between the insulating substrate 52 and the electrode patterns 51 and 53.

Along with the enlargement of the usage temperature range of the semiconductor device 100 (to higher temperature or lower temperature), the silicone rubber 10 is more expanded or contracted as compared to the related art by the heat cycle. When the area of the silicone rubber 10 covering the base plate 1 is large, with the high stress generated due to expansion or contraction of the silicone rubber 10, there is a risk that the silicone rubber 10 may be separated from various members due to a difference in linear expansion coefficient between the silicone rubber 10 and various members such as the base plate 1 and the solder 3 or other bonding materials.

For example, the linear expansion coefficient of the silicone rubber 10 is generally from 300 ppm/K to 400 ppm/K. When the hardness of the silicone rubber 10 is higher than 70 in Shore A hardness, separation between the silicone rubber 10 and various members is liable to occur.

Further, even when separation between the silicone rubber 10 and the various members does not occur, the stress generated from the silicone rubber 10 causes a crack in the solder or other bonding materials. Therefore, the hardness of the silicone rubber 10 is desired to be 70 or less in Shore A hardness. Further, the hardness of the silicone rubber 10 is preferred to be 10 or more in Shore A hardness to suppress generation of air bubbles from the lower side of the insulating substrate 52 to secure firm adhesion to the base plate 1. As a result, the hardness of the silicone rubber 10 is desired to be 10 or more and 70 or less in Shore A hardness.

In the semiconductor device configured as described above, the space S1 surrounded by the base plate 1 and the insulating circuit board 5 and the peripheral edge portion of the insulating circuit board 5 are filled with the silicone rubber 10, and hence generation of air bubbles in the space S1 can be suppressed. As a result, with the suppression of separation between the silicone rubber 10 and the base plate 1 in the space S1, the insulation distance can be secured at the surface portion of the insulating circuit board 5, and thus the insulation reliability of the semiconductor device can be improved.

Second Embodiment

A second embodiment of the present invention differs from the first embodiment in that a plurality of insulating circuit boards 5 used in the first embodiment are arranged in the case. Other points are similar to those in the first embodiment, and hence detailed description thereof is omitted. Even when a plurality of insulating circuit boards are arranged in the case as described above, the peripheral edge portions of the insulating circuit boards are filled with silicone rubber, and hence the insulation reliability of the semiconductor device can be improved.

Figure 5:
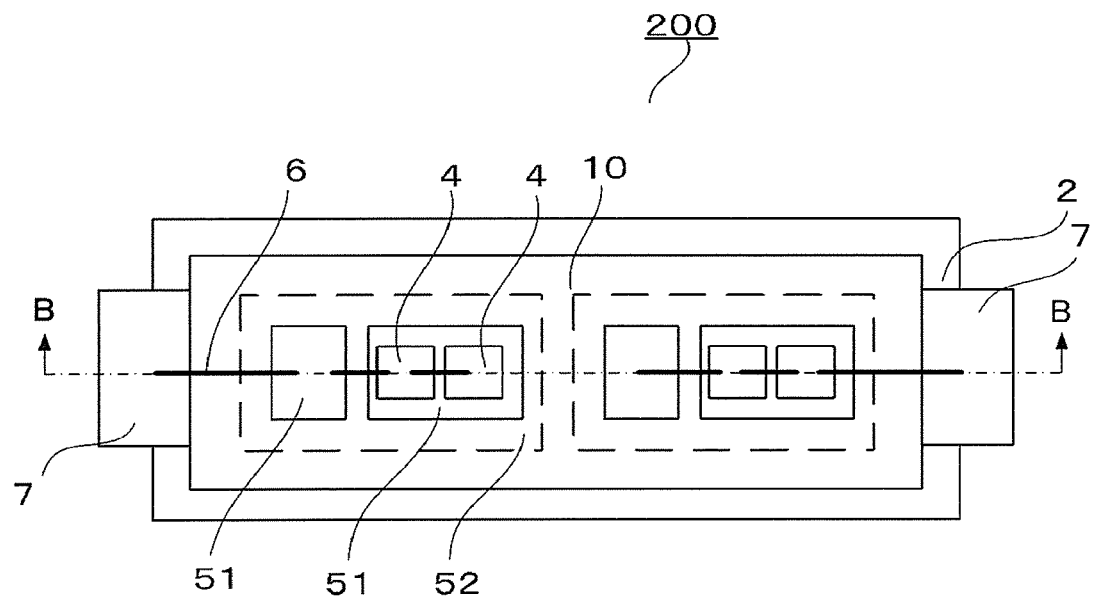
FIG. 5 is a schematic top structure view for illustrating a semiconductor device according to a second embodiment of the present invention.
Figure 6:
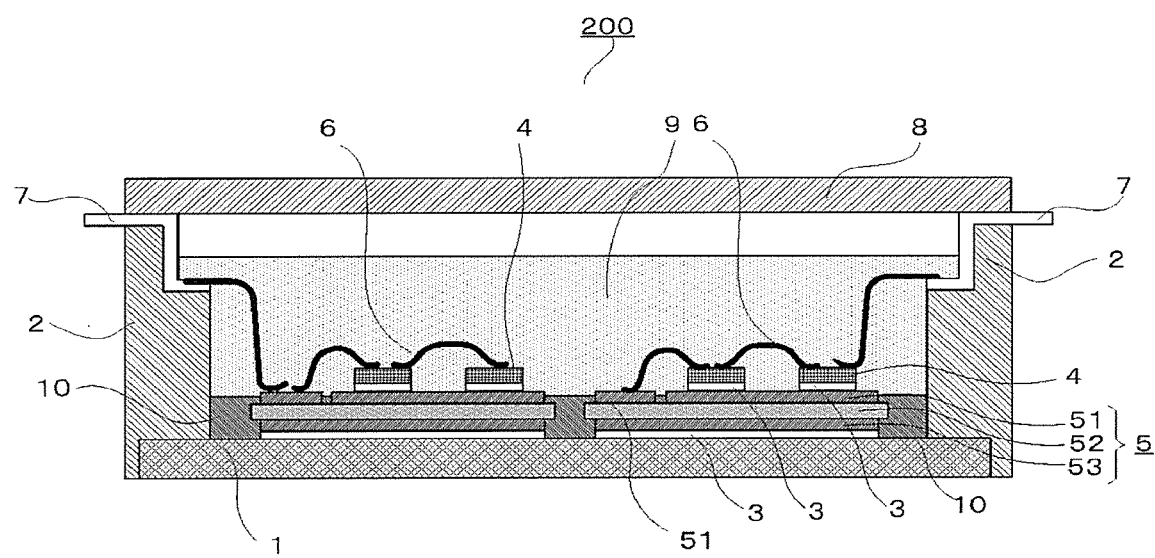
FIG. 6 is a schematic sectional structure view for illustrating the semiconductor device according to the second embodiment of the present invention.

FIG. 5 is a schematic top structure view for illustrating a semiconductor device according to a second embodiment of the present invention. FIG. 6 is a schematic sectional structure view for illustrating the semiconductor device according to the second embodiment of the present invention. FIG. 5 is a view for illustrating a semiconductor device 200 as viewed from the top through the first filler 9 being a silicone composition. A peripheral edge portion (outer peripheral portion) of the insulating substrate 52, which is covered with the second filler 10 being a silicone composition, is indicated by the dotted line.

Further, FIG. 6 is a schematic sectional structure view taken along the dash-dotted line B-B of FIG. 5. In FIG. 6, the semiconductor device 200 includes the base plate 1, the case member 2, the solder 3 serving as a bonding material, the semiconductor elements 4, the insulating circuit board 5, the bonding wires 6 serving as wiring members, the electrode terminals 7, the lid member 8, the first filler 9 being a silicone composition, the second filler 10 being a silicone composition, the electrode patterns 51 and 53 serving as conductor layers, and the insulating substrate 52. Further, the semiconductor device 200 has a configuration in which the plurality of insulating circuit boards 5 are arranged adjacent to each other.

The insulating circuit board 5 includes the insulating substrate 52, the electrode pattern 51 formed on an upper face (front face) side of the insulating substrate 52, and the electrode pattern 53 formed on a lower face (back face) side of the insulating substrate 52. On the electrode pattern 51 formed on the upper face side of the insulating substrate 52, the semiconductor elements 4 are electrically bonded via the solder or other bonding materials 3. In this case, for example, as the semiconductor element 4, a power control semiconductor element such as a MOSFET, which is configured to control a large current, or a diode for freewheeling is used.

Further, in the insulating circuit board 5, the electrode pattern 53 formed on the lower face side of the insulating substrate 52 is fixed to the base plate 1 via the solder or other bonding materials 3. Further, the base plate 1 serves as a bottom plate of the semiconductor device 200 so as to form a region (hereinafter referred to as "case") surrounded by the base plate 1 and the case member 2 arranged at the periphery of the base plate 1.

For the purpose of securing an insulation property inside the region surrounded by the case member 2 of the semiconductor device 200, the first filler 9 being a silicone composition and the second filler 10 being a silicone composition are injected into the case. The first filler 9 is, for example, a silicone gel, and is injected up to a height that allows the semiconductor elements 4 and the bonding wires 6 to be sealed with the silicone gel 9.

Further, the second filler 10 being a silicone composition injected below the silicone gel 9 in the case is, for example, silicone rubber, and is injected so as to surround a peripheral edge portion of the insulating substrate 52. The silicone rubber 10 is injected up to a filling height position that is higher than an upper face of the insulating substrate 52 from a front surface of the base plate 1, and is lower than a bonding face between the semiconductor element 4 and the solder 3, that is, a mounting surface (mounting portion) of the semiconductor element 4, which is an upper face of the electrode pattern 51 formed on the upper face side of the insulating substrate 52.

At this time, the silicone rubber 10 surrounds the peripheral edge portion of the insulating substrate 52, and fills an exposed part of the insulating substrate 52. The silicone rubber 10 is injected up to the same height in a space between the plurality of electrode patterns 51 formed on the upper face of the insulating substrate 52.

Further, the silicone gel 9 is injected onto the silicone rubber 10 so that the case is filled with the filler.

Figure 7:
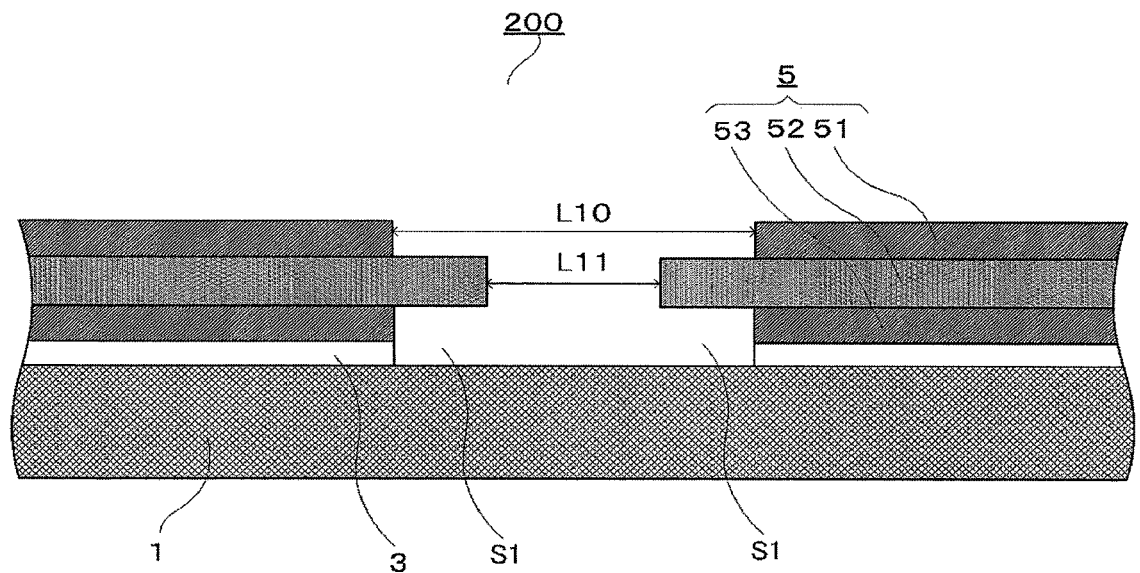
FIG. 7 is a schematic sectional structure view for illustrating a space between two insulating circuit boards in the semiconductor device according to the second embodiment of the present invention.

FIG. 7 is a schematic sectional structure view for illustrating a space between two insulating circuit boards in the semiconductor device according to the second embodiment of the present invention. In FIG. 7, a dimension between the two insulating substrates 52 is represented by L11, and a dimension between the electrode patterns 51 formed on the two insulating substrates 52 is represented by L10.

The dimension of L11 can be considered in the same manner as in the case of the insulating substrate 52 and the case member 2 illustrated in FIG. 3. L11 is generally a distance of 2 mm or more in consideration of misalignment at the time of bonding between the insulating circuit board 5 and the base plate 1. In a case where L11 is 2 mm or less, when the insulating circuit board 5 is arranged on the base plate 1, the insulating circuit board 5 cannot be arranged at a predetermined position due to a shift during alignment.

Further, when L11 is 10 mm or more, a ratio of the silicone rubber 10 occupied in the case is increased, which causes occurrence of stress. Thus, the silicone rubber 10 may be separated from the base plate 1.

The silicone rubber 10 injected into the space S1 between the base plate 1 and the surface portion on the lower face side of the insulating substrate 52 "adheres" to the insulating substrate 52 and the base plate 1. The silicone gel 9 is brought into "close contact" with various members, and has a characteristic in which the silicone gel 9 may be brought into close contact again even after the silicone gel 9 is separated from the members. Meanwhile, the silicone rubber 10 does not adhere to the members again after the silicone rubber 10 is once separated from the members.

The silicone rubber 10 has higher hardness than that of the silicone gel 9, and has a tendency that separation is liable to occur due to stress that occurs at an interface between the silicone rubber 10 and various members due to a difference in linear expansion coefficient and an elastic modulus during the heat cycle applied to the semiconductor device. Therefore, in a region of the silicone rubber 10 that is directly brought into contact with the base plate 1, the generated stress can be suppressed by setting the distance L11 between the end portion of one insulating circuit board 5 and the end portion of another insulating circuit board 5 to 10 mm or less, although the stress differs depending on the hardness of the silicone rubber 10. Therefore, a semiconductor device having high insulation reliability can be manufactured.

For those reasons, the dimension of L11 is set in a range of 2 mm or more and 10 mm or less so that the semiconductor device having secured insulation reliability can be configured.

In the semiconductor device configured as described above, the space S1 surrounded by the base plate 1 and the insulating circuit board 5 and the peripheral edge portion of the insulating circuit board 5 are filled with the silicone rubber 10, and hence generation of air bubbles in the space S1 can be suppressed. As a result, with the suppression of separation between the silicone rubber 10 and the base plate 1 in the space S1, the insulation distance can be secured at the surface portion of the insulating circuit board 5, and thus the insulation reliability of the semiconductor device can be improved.

Further, even when the plurality of insulating circuit boards 5 are arranged in the case, the space between the plurality of insulating circuit boards 5 is filled with the silicone rubber 10, and hence generation of air bubbles can be suppressed between the plurality of insulating circuit boards 5. As a result, with the suppression of separation between the silicone rubber 10 and the base plate 1 between the plurality of insulating circuit boards 5, the insulation distance can be secured at the surface portion of the insulating circuit board 5, and thus the insulation reliability of the semiconductor device can be improved.

Third Embodiment

A third embodiment of the present invention differs from of the first embodiment in that the periphery of the insulating circuit board 5 used in the first and second embodiments is surrounded by a partition wall. Other points are similar to those of the first embodiment, and hence detailed description thereof is omitted. Through surrounding of the periphery of the insulating circuit board by the partition wall as described above, the insulation reliability is affected, and a region in which filling of silicone rubber is required is filled with the silicone rubber. Therefore, the insulation reliability of the semiconductor device can be improved.

Figure 8:
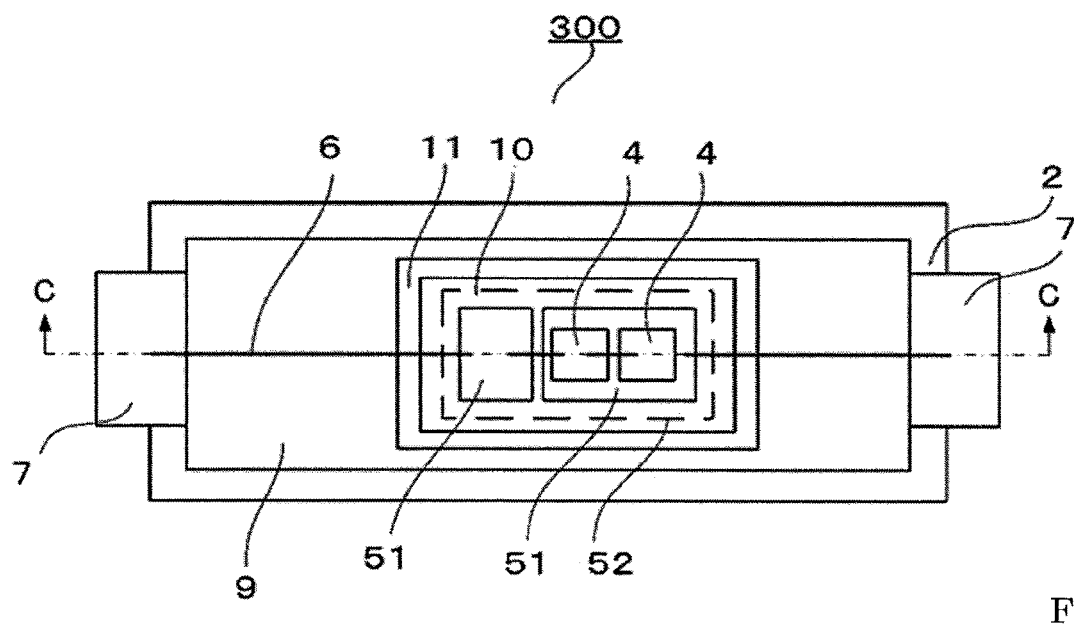
FIG. 8 is a schematic top structure view for illustrating a semiconductor device according to a third embodiment of the present invention.
Figure 9:
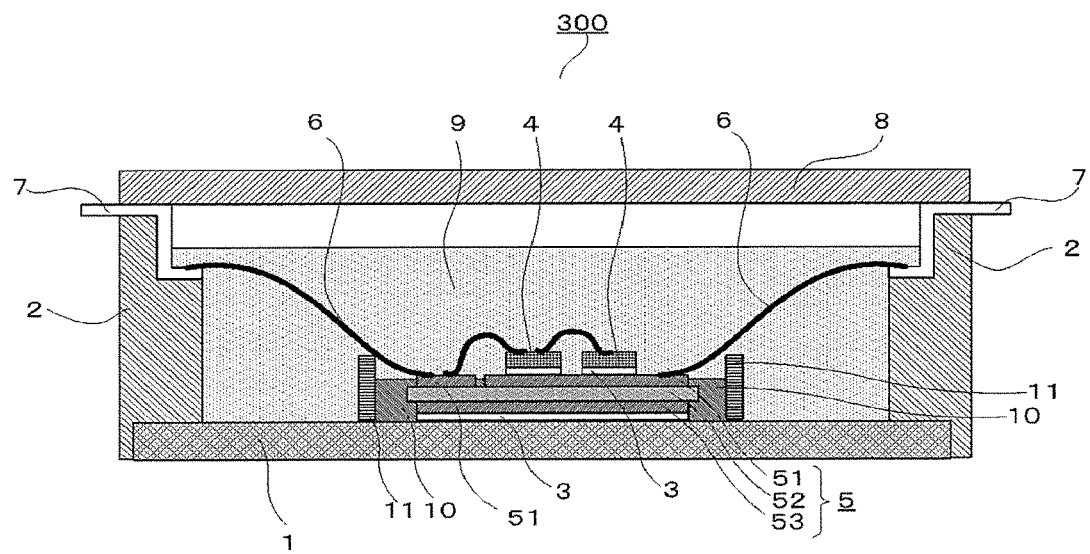
FIG. 9 is a schematic sectional structure view for illustrating the semiconductor device according to the third embodiment of the present invention.

FIG. 8 is a schematic top structure view for illustrating a semiconductor device according to the third embodiment of the present invention. FIG. 9 is a schematic sectional structure view for illustrating the semiconductor device according to the third embodiment of the present invention. FIG. 8 and FIG. 9 are illustrations of a case in which the number of insulating circuit boards is 1.

FIG. 8 is a view for illustrating a semiconductor device 300 as viewed from the top through the first filler 9 being a silicone composition. The peripheral edge portion (outer peripheral portion) of the insulating substrate 52 covered with the second filler 10 being a silicone composition is indicated by the dotted line. The partition wall 11 is formed so as to surround the insulating circuit board 5 along the entire periphery of the outer peripheral portion (peripheral edge portion) of the insulating circuit board 5. The inner side of the partition wall 11 is filled with the silicone rubber 10, and the outer side of the partition wall 11 is filled with the silicone gel 9.

FIG. 9 is a schematic sectional structure view taken along the dash-dotted line C-C of FIG. 8. In FIG. 9, the semiconductor device 300 includes the base plate 1, the case member 2, the solder 3 serving as a bonding material, the semiconductor elements 4, the insulating circuit board 5, the bonding wires 6 serving as wiring members, the electrode terminals 7, the lid member 8, the first filler 9 being a silicone composition, the second filler 10 being a silicone composition, the partition wall 11, the electrode patterns 51 and 53 serving as conductor layers, and the insulating substrate 52.

Further, the partition wall 11 is formed around the outer peripheral portion (peripheral edge portion) of the insulating circuit board 5 so as to surround the insulating circuit board 5. The inner side of the partition wall 11 is filled with the silicone rubber 10, and the outer side of the partition wall 11 is filled with the silicone gel 9.

For the partition wall 11, a thermoplastic resin and a thermosetting resin can be used. For example, as the thermosetting resin, a silicone resin can be used, but the material is not particularly limited as long as the material can function as a dam wall for preventing the silicone rubber 10 from spreading, the material can maintain the shape in a curing temperature range of the silicone rubber 10, and the material has a non-conductive property.

Along with the enlargement of the usage temperature range of the semiconductor device 300 (to higher temperature or lower temperature), the silicone rubber 10 is more expanded or contracted as compared to the related art by the heat cycle. When the area of the silicone rubber 10 covering the base plate 1 is large, with the high stress generated due to expansion or contraction of the silicone rubber 10, there is a risk that the silicone rubber 10 may be separated from various members due to a difference in linear expansion coefficient between the silicone rubber 10 and various members such as the base plate 1 and the solder 3 or other bonding materials.

For example, the coefficient of linear expansion of the silicone rubber 10 is generally from 300 ppm/K to 400 ppm/K. When the hardness of the silicone rubber 10 is higher than 70 in Shore A hardness, separation between the silicone rubber 10 and various members is liable to occur.

Further, even when separation between the silicone rubber 10 and the various members does not occur, the stress generated from the silicone rubber 10 causes a crack in the solder or other bonding materials. Therefore, the hardness of the silicone rubber 10 is desired to be 70 or less in Shore A hardness. Further, the hardness of the silicone rubber 10 is preferred to be 10 or more in Shore A hardness to suppress generation of air bubbles from the lower side of the insulating substrate 52 to secure firm adhesion to the base plate 1.

Even when the partition wall 11 is used as in the third embodiment, dielectric breakdown can be considered similarly to that in the case of the first and second embodiments. That is, this case is similar to the case in which the case member 2 is replaced with the partition wall 11 in FIG. 3. Therefore, the lengths L1, L2, L3, L4, and L5 are only required to be set so that the semiconductor device 300 can secure an insulation distance satisfying the dielectric breakdown voltage. Further, the distance L6 between the partition wall 11 and the insulating substrate 52 is generally 2 mm or more in consideration of the misalignment at the time of bonding between the insulating circuit board 5 and the base plate 1. In a case where L6 is 2 mm or less, when the insulating circuit board 5 is arranged on the base plate 1, the insulating circuit board 5 cannot be arranged at a predetermined position due to a shift during alignment. When L6 is 10 mm or more, a ratio of the silicone rubber 10 occupied on the inner side of the partition wall 11 is increased, which causes occurrence of stress. Thus, the silicone rubber 10 may be separated from the base plate 1. For those reasons, the dimension of L6 is set in a range of 2 mm or more and 10 mm or less so that a semiconductor device having secured insulation reliability can be configured.

In the semiconductor device 300 according to the third embodiment, even when the silicone rubber 10 has high hardness, with use of the partition wall 11, the filling region of the silicone rubber 10 can be reduced as compared to the cases of other embodiments of the present invention, and the separation of the silicone rubber 10 from the base plate 1 or the insulating circuit board 5 can be suppressed. In addition, generation of a crack in the bonding material 3 can be suppressed, and with the effect of the silicone rubber 10, a semiconductor device having higher insulation reliability as compared to the insulating characteristic of the semiconductor device 100 described in the first embodiment can be manufactured.

In this case, the range of the distance between the partition wall 11 and the end portion of the insulating substrate 52 is required to be set to be smaller than a range of 2 mm or more and 10 mm or less. The case in which the upper limit value is 10 mm is the same as the case in which the case member 2 is replaced with the partition wall 11, and the ratio of the silicone rubber 10 to be injected into the inner side of the partition wall 11 is not decreased. Therefore, in order to decrease the ratio of the silicone rubber 10 to be injected into the inner side of the partition wall 11, the upper limit value of the distance from the end portion of the insulating substrate 52 is required to be set to a value smaller than 10 mm. For example, the distance can be set to 5 mm or less to decrease the ratio. When the ratio of the silicone rubber 10 on the inner side of the partition wall 11 is to be decreased, the distance from the end portion of the insulating substrate 52 to the partition wall 11 is desired to be set in a range of 2 mm or more and 5 mm or less.

Figure 10:
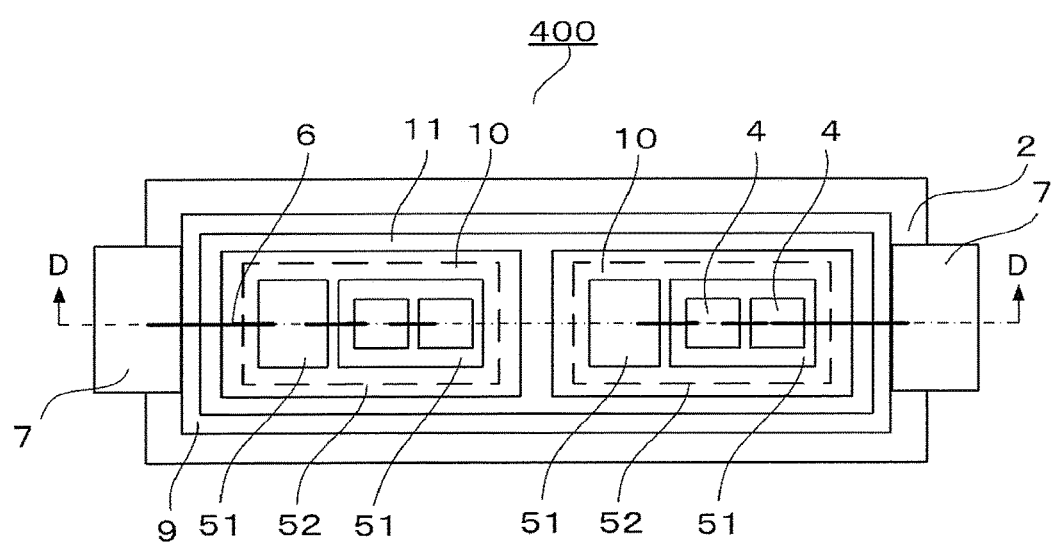
FIG. 10 is a schematic top structure view for illustrating another semiconductor device according to the third embodiment of the present invention.
Figure 11:
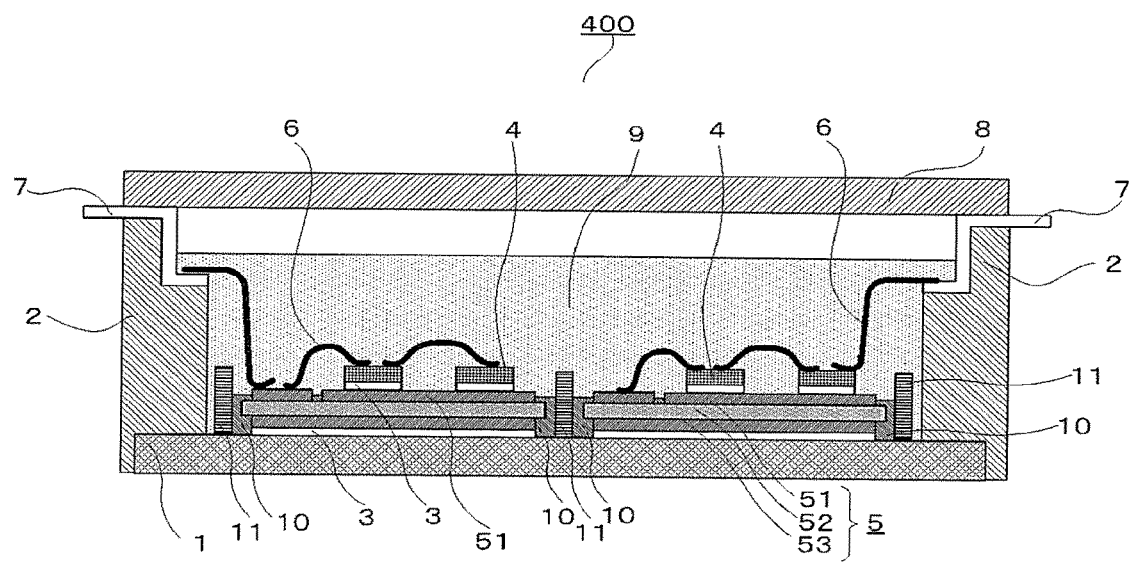
FIG. 11 is a schematic sectional structure view for illustrating the another semiconductor device according to the third embodiment of the present invention.
Figure 12:
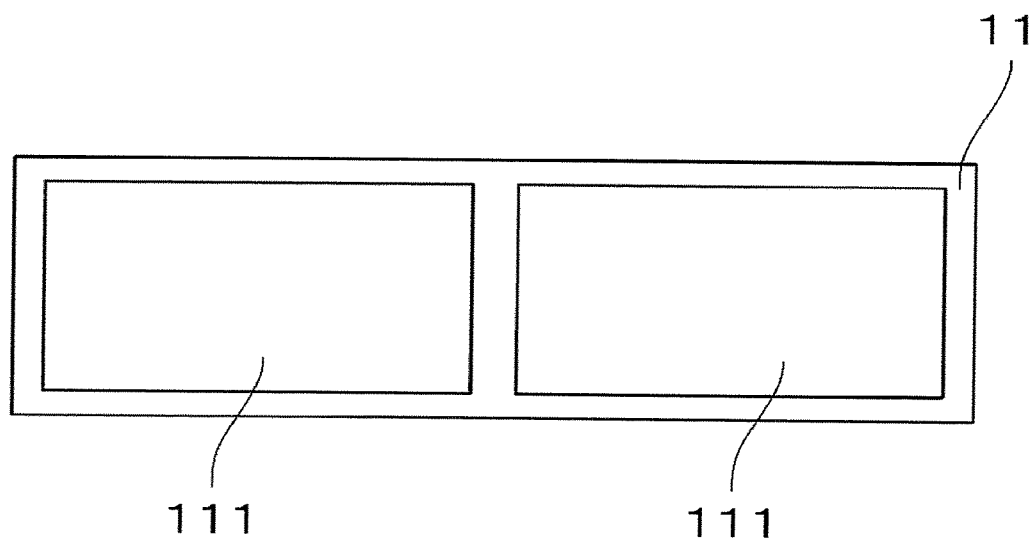
FIG. 12 is a schematic top structure view for illustrating a partition wall of the semiconductor device according to the third embodiment of the present invention.

FIG. 10 is a schematic top structure view for illustrating another semiconductor device according to the third embodiment of the present invention. FIG. 11 is a schematic sectional structure view for illustrating the semiconductor device according to the third embodiment of the present invention. FIG. 12 is a schematic top structure view for illustrating the partition wall of the semiconductor device according to the third embodiment of the present invention. FIG. 10, FIG. 11, FIG. 12 are illustrations of a case in which a plurality of (two) insulating circuit boards are provided.

FIG. 10 is a view for illustrating a semiconductor device 400 as viewed from the top through the first filler 9 being a silicone composition. The peripheral edge portion (outer peripheral portion) of the insulating substrate 52 covered with the second filler 10 being a silicone composition is indicated by the dotted line.

In FIG. 10, the partition wall 11 is formed so as to surround the insulating circuit board 5 along the entire periphery of the outer peripheral portion (peripheral edge portion) of the insulating circuit board 5. The inner side of the partition wall 11 is filled with the silicone rubber 10, and the outer side of the partition wall 11 is filled with the silicone gel 9.

FIG. 11 is a schematic sectional structure view taken along the dash-dotted line D-D of FIG. 10. In FIG. 11, the semiconductor device 400 includes the base plate 1, the case member 2, the solder 3 serving as a bonding material, the semiconductor elements 4, the insulating circuit boards 5, the bonding wires 6 serving as wiring members, the electrode terminals 7, the lid member 8, the first filler 9 being a silicone composition, the second filler 10 being a silicone composition, the partition wall 11, the electrode patterns 51 and 53, and the insulating substrates 52.

In the semiconductor device 400, two insulating circuit boards 5 are arranged as an example of a case in which a plurality of insulating circuit boards 5 are arranged in the case 2. The partition wall 11 is formed around the outer peripheral portion (peripheral edge portion) of the two insulating circuit boards 5 so as to surround the insulating circuit boards 5. The inner side of the partition wall 11 is filled with the silicone rubber 10, and the outer side of the partition wall 11 is filled with the silicone gel 9.

For the partition wall 11, a thermoplastic resin and a thermosetting resin can be used. For example, as the thermosetting resin, a silicone resin can be used, but the material is not particularly limited as long as the material can function as a dam wall for preventing the silicone rubber 10 from spreading, the material can maintain the shape in a curing temperature range of the silicone rubber 10, and the material has a non-conductive property.

As illustrated in FIG. 12, the partition wall 11 formed between the two insulating circuit boards 5 is shared by the two insulating circuit boards 5. The partition wall 11 has arrangement regions 111 for arranging the insulating circuit boards 5. The insulating circuit boards 5 are arranged in the arrangement regions 111 while maintaining the dimension of L6. Further, as the partition wall 11, as illustrated in FIG. 9, the partition wall 11 may be arranged so as to surround the entire outer peripheral portion of each of the insulating circuit boards 5 independently for the individual insulating circuit boards 5.

In the semiconductor device configured as described above, the space S1 surrounded by the base plate 1 and the insulating circuit board 5 and the peripheral edge portion of the insulating circuit board 5 are filled with the silicone rubber 10, and hence generation of air bubbles in the space S1 can be suppressed. As a result, with the suppression of separation between the silicone rubber 10 and the base plate 1 in the space S1, the insulation distance can be secured at the surface portion of the insulating circuit board 5, and thus the insulation reliability of the semiconductor device can be improved.

Further, even when the plurality of insulating circuit boards 5 are arranged in the case, the space between the plurality of insulating circuit boards 5 is filled with the silicone rubber 10, and hence generation of air bubbles can be suppressed between the plurality of insulating circuit boards 5. As a result, with the suppression of separation between the silicone rubber 10 and the base plate 1 between the plurality of insulating circuit boards 5, the insulation distance can be secured at the surface portion of the insulating circuit board 5, and thus the insulation reliability of the semiconductor device can be improved.

Further, the partition wall 11 is provided, and hence the region to be filled with the silicone rubber 10 can be minimized, and generation of a crack in the bonding material 3 can be suppressed. Thus, a semiconductor device having higher insulation reliability as compared to the insulating characteristic of the semiconductor device 100 described in the first embodiment can be manufactured.

Fourth Embodiment

In a fourth embodiment of the present invention, the semiconductor device according to any one of the above-mentioned first to third embodiments is applied to an electric power converter. The present invention is not limited to a specific electric power converter, but as the fourth embodiment, a case in which the present invention is applied to a three-phase inverter is described below.

Figure 13:
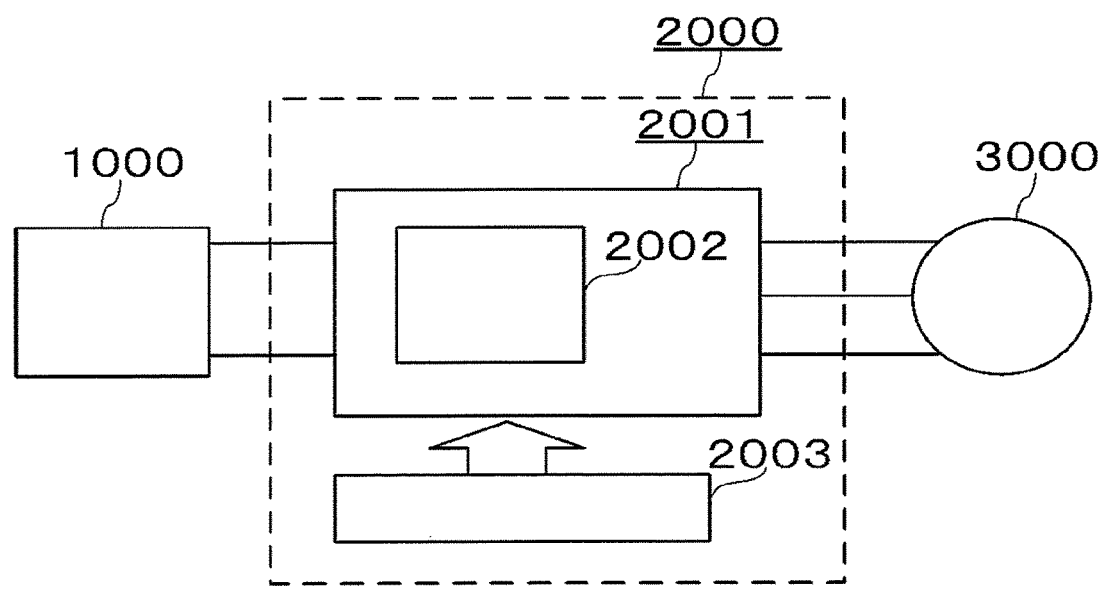
FIG. 13 is a block diagram for illustrating a configuration of a power conversion system to which an electric power converter according to a fourth embodiment of the present invention is applied.

FIG. 13 is a block diagram for illustrating a configuration of a power conversion system to which an electric power converter according to the fourth embodiment of the present invention is applied.

The power conversion system illustrated in FIG. 13 includes a power supply 1000, an electric power converter 2000, and a load 3000. The power supply 1000 is a DC power supply, and is configured to supply DC power to the electric power converter 2000. Various power supplies can be employed as the power supply 1000. For example, a DC system, a solar battery, or a storage battery can be employed, or a rectifier circuit or an AC/DC converter connected to an AC system can be employed. Further, the power supply 1000 can be configured by a DC/DC converter configured to convert DC power output from a DC system into predetermined power.

The electric power converter 2000 is a three-phase inverter connected between the power supply 1000 and the load 3000, and is configured to convert the DC power supplied from the power supply 1000 into AC power to supply the AC power to the load 3000. As illustrated in FIG. 13, the electric power converter 2000 includes a main conversion circuit 2001 configured to convert the DC power into AC power to output the AC power, and a control circuit 2003 configured to output a control signal for controlling the main conversion circuit 2001 to the main conversion circuit 2001.

The load 3000 is a three-phase electric motor to be driven by the AC power supplied from the electric power converter 2000. The load 3000 is not limited to a specific application, and may be an electric motor mounted on various types of electric equipment. For example, the load 3000 is used as an electric motor for a hybrid vehicle, an electric vehicle, a railway car, an elevator, or an air-conditioning apparatus.

Now, details of the electric power converter 2000 are described. The main conversion circuit 2001 includes a switching element (not shown) and a free-wheeling diode (not shown), which are built in a semiconductor device 2002. When the switching element is switched, the DC power supplied from the power supply 1000 is converted into the AC power, which is supplied to the load 3000. There are various types of specific circuit configurations of the main conversion circuit 2001, but the main conversion circuit 2001 in the fourth embodiment is a two-level three-phase full-bridge circuit, which can be formed of six switching elements and six free-wheeling diodes that are connected in anti-parallel to the respective switching elements. The main conversion circuit 2001 includes the semiconductor device 2002 corresponding to any one of the above-mentioned first to third embodiments, which includes the built-in switching elements and the built-in free-wheeling diodes. Every two of the six switching elements are connected in series to form upper and lower arms. Each of the upper and lower arms forms each phase (U phase, V phase, or W phase) of the full-bridge circuit. Further, output terminals of the upper and lower arms, that is, three output terminals of the main conversion circuit 2001 are connected to the load 3000.

Further, the main conversion circuit 2001 includes a drive circuit (not shown) configured to drive each switching element. The drive circuit may be built into the semiconductor device 2002, or a drive circuit may be provided separately from the semiconductor device 2002. The drive circuit is configured to generate a drive signal for driving the switching elements of the main conversion circuit 2001, and to supply the drive signal to control electrodes of the switching elements of the main conversion circuit 2001. Specifically, in response to the control signal from the control circuit 2003 to be described later, a drive signal for turning on the switching element and a drive signal for turning off the switching element are output to the control electrodes of the switching elements. When the ON state of the switching element is to be maintained, the drive signal is a voltage signal (ON signal) that is equal to or larger than a threshold voltage of the switching element, and when the OFF state of the switching element is to be maintained, the drive signal is a voltage signal (OFF signal) that is equal to or smaller than the threshold voltage of the switching element.

The control circuit 2003 controls the switching elements of the main conversion circuit 2001 so that desired power is supplied to the load 3000. Specifically, the control circuit 2003 calculates a time period (ON time period) in which each switching element of the main conversion circuit 2001 is required to be in the ON state based on the power to be supplied to the load 3000. For example, the control circuit 2003 can control the main conversion circuit 2001 based on PWM control of modulating the ON time period of the switching element in accordance with the voltage to be output. Then, the control circuit 2003 outputs a control command (control signal) to the drive circuit of the main conversion circuit 2001 so that an ON signal is output to the switching element to be brought into the ON state and an OFF signal is output to the switching element to be brought into the OFF state at each time point. The drive circuit outputs the ON signal or the OFF signal as the drive signal to the control electrode of each switching element in accordance with this control signal.

In the electric power converter according to the fourth embodiment configured as described above, the semiconductor device according to any one of the first to third embodiments is applied as the semiconductor device 2002 of the main conversion circuit 2001, and hence the reliability can be improved.

In the fourth embodiment, description has been given of the example in which the present invention is applied to the two-level three-phase inverter, but the present invention is not limited thereto. The present invention is applicable to various electric power converters. Although the two-level electric power converter is employed in the fourth embodiment, a three-level or multi-level electric power converter may be employed, and the present invention may be applied to a single-phase inverter when power is to be supplied to a single-phase load. Further, when power is to be supplied to a DC load or the like, the present invention is applicable to a DC/DC converter or an AC/DC converter.

Further, the electric power converter to which the present invention is applied is not limited to an electric power converter in which the load is an electric motor as described above. For example, the electric power converter can be used as a power supply apparatus for an electrical discharge machine, a laser beam processing machine, an induction heating cooker, or a non-contact power feeding system. Further, the electric power converter can be used as a power conditioner for, for example, a solar power system or an electricity storage system.

The embodiments described above should be regarded not as limiting but as exemplary in all respects. The scope of the present invention is not defined by the scope of the embodiments described above, but is defined by the appended claims, and includes all equivalents and variations that fall within the scope of the claims.

Further, the invention may be formed by combining a plurality of components disclosed in the above-mentioned embodiments as appropriate.

EXAMPLES

There are shown results of evaluating the initial insulating characteristic of the semiconductor device and the insulating characteristics thereof changed with the number of times of heat cycle test with use of evaluation samples (semiconductor devices) having structures corresponding to the first to third embodiments, while changing a rubber material to be injected, the height of the rubber material to be injected, and a narrow gap region interval. The heat cycle test was conducted by placing the entire semiconductor device into a constant temperature reservoir whose temperature was controllable, and repeatedly changing the temperature of the constant temperature reservoir in a range of from −40° C. to 180° C. In the heat cycle test, as one cycle, the evaluation sample is held at −40° C. for 30 minutes and then held at 200° C. for 30 minutes, and this cycle is repeated 1,000 times.

Example 1

The evaluation sample corresponding to the first embodiment was manufactured as follows. The semiconductor element having a size of 11 mm×12 mm and the insulating circuit board 5 (made of ceramic) having a size of 50 mm×60 mm were mounted on the base plate 1 being a metal plate having a size of 100 mm×150 mm via the solder 3 serving as a bonding material. As the bonding wires 6, aluminum wires having diameters of 0.4 mm and 0.2 mm were used. On the metal plate 1, the case member 2 formed by insert molding was mounted with an adhesive, and then the silicone rubber 10 was injected up to various heights. The filling silicone gel 9 having hardness of 70 in penetration was injected onto the upper surface of the silicone rubber 10.

In order to promote generation of air bubbles and occurrence of separation in the silicone gel 9, the semiconductor device formed of the above-mentioned members was not subjected to decompression processing for reducing air bubbles, and was manufactured by injecting the silicone gel 9 into the region surrounded by the case member 2 under atmospheric pressure, leaving the silicone gel 9 under atmospheric pressure for 30 minutes, and then curing the silicone gel 9 at 90° C./1 hr. As results of the heat cycle test, the initial dielectric breakdown voltage and the dielectric breakdown voltages for every 250 cycles were measured.

In Table 1, there are shown results of the heat cycle test and results of external appearance observation of the evaluation sample having the structure illustrated in FIG. 2, that is, the evaluation samples manufactured by injecting the silicone rubber 10 into the lower portion of the insulating substrate 52 of the semiconductor device 100.

Figure 14:
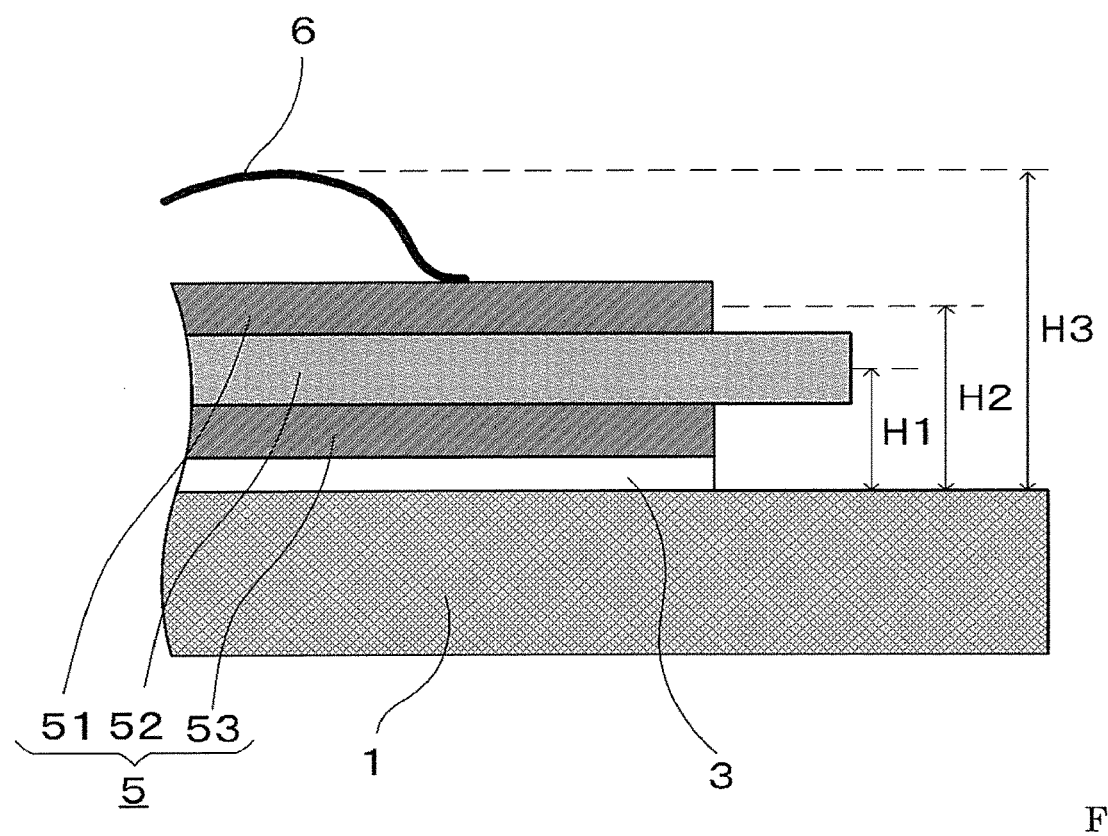
FIG. 14 is a schematic sectional structure view for illustrating a filling height of silicone rubber at a peripheral edge portion of an insulating circuit board in embodiments of the present invention.

FIG. 14 is a schematic sectional structure view for illustrating the filling height of the silicone rubber at the peripheral edge portion of the insulating circuit board in Example of the present invention. As illustrated in FIG. 14, the heat cycle test was conducted under four conditions in which the respective filling heights of the silicone rubber 10 were 0 (none), H1 (height for covering two faces, specifically, the lower face and the side face of the insulating circuit board 5), H2 (height for covering three faces, specifically, the lower face, the side face, and the upper face of the insulating circuit board 5), and H3 (height for covering three faces, specifically, the lower face, the side face, and the upper face of the insulating circuit board 5 and the wire bonding). Three semiconductor devices were evaluated in each type of evaluations.

In Table 1, in the dielectric breakdown voltage test and the continuity test conducted at the time of the heat cycle test, "○" is noted for items in which all three semiconductor devices passed the test, "Δ" is noted for items in which one or two semiconductor devices passed the test, and "×" is noted for items in which no semiconductor device passed the test.

TABLE 1

Reliability test (heat cycle test: −40° C./200° C.)

| | | Number of test cycles/cyc | | | |
|---|---|---|---|---|---|
| | | 0 | 250 | 500 | 1,000 |
| Filling rubber: none | Dielectric breakdown voltage | ○ | x | x | x |
| | Continuity test | ○ | ○ | ○ | ○ |
| Rubber height: H1 | Dielectric breakdown voltage | ○ | ○ | Δ | Δ |
| | Continuity test | ○ | ○ | ○ | ○ |
| Rubber height: H2 | Dielectric breakdown voltage | ○ | ○ | ○ | ○ |
| | Continuity test | ○ | ○ | ○ | ○ |
| Rubber height: H3 | Dielectric breakdown voltage | ○ | ○ | ○ | ○ |
| | Continuity test | ○ | Δ | x | x |

The test results shown in Table 1 are described. In the sample without the silicone rubber, it was found that, when 250 cycles (cyc) of heat cycle test were conducted, air bubbles in the vicinity of the insulating circuit board were enlarged and the dielectric breakdown voltage was decreased. Further, in the sample in which the silicone rubber height was set to H1, it was found that the dielectric breakdown voltage was decreased when 500 cycles (cyc) of heat cycle test were conducted. In contrast, in the sample in which the silicone rubber height was set to H2, it was found that the dielectric breakdown voltage was maintained even after 1,000 cycles (cyc) of heat cycle test were conducted. Further, in the sample in which the silicone rubber height was set to H3, it was found that continuity failure occurred due to bonding wire disconnection when 250 cycles (cyc) of heat cycle test were conducted.

From the above-mentioned results, it has been found that, through injection of silicone rubber into the lower portion of the insulating circuit board of the semiconductor device, generation and enlargement of air bubbles can suppressed, and the dielectric breakdown voltage can maintained. Further, it has been found that a high effect can obtained when the height of the silicone rubber is set to cover the end portion of the front-face electrode pattern at which the frequency of generation of air bubbles in the filler material is high, that is, to cover the three faces, specifically, the lower face, the side face, and the upper face of the insulating substrate. Further, it has been found that wire disconnection occurs when the wire bonding is covered.

Example 2

The evaluation samples corresponding to the first and second embodiments were manufactured as follows. The semiconductor element having a size of 11 mm×12 mm and the insulating circuit board (made of ceramic) having a size of 50 mm×60 mm were mounted on the base plate being a metal plate having a size of 100 mm×150 mm through via the solder serving as a bonding material. As the bonding wires, aluminum wires having diameters of 0.4 mm and 0.2 mm were used. On the metal plate, the case member formed by insert molding was mounted with an adhesive, and then various silicone rubbers having different viscosities were injected. The silicone gel having hardness of 70 in penetration was injected onto the upper surface of the silicone rubber.

In Table 2, there are shown results of measuring initial partial discharge characteristics after injecting various silicone rubbers having viscosities of 80 Pa·s, 40 Pa·s, 20 Pa·s, 5 Pa·s, and 0.5 Pa·s into the evaluation samples set to have three conditions of the electrode pattern thickness of the insulating circuit board of 1,000 μm, 500 μm, and 300 μm and four conditions of the creepage distance, which corresponds to the ceramic exposed portion of the insulating circuit board, of 1 mm, 1.5 mm, 2 mm, and 2.5 mm.

TABLE 2

Partial discharge characteristic evaluation

| Narrow gap interval | | Creepage distance: 1 mm | Creepage distance: 1.5 mm | Creepage distance: 2 mm | Creepage distance: 2.5 mm |
|---|---|---|---|---|---|
| Viscosity: 80 Pa·s | Thickness: 1,000 μm | ○ | Δ | x | x |
| | Thickness: 500 μm | ○ | Δ | x | x |
| | Thickness: 300 μm | Δ | x | x | x |
| Viscosity: 40 Pa·s | Thickness: 1,000 μm | ○ | ○ | ○ | Δ |
| | Thickness: 500 μm | ○ | ○ | Δ | Δ |
| | Thickness: 300 μm | ○ | Δ | Δ | Δ |
| Viscosity: 20 Pa·s | Thickness: 1,000 μm | ○ | ○ | ○ | ○ |
| | Thickness: 500 μm | ○ | ○ | ○ | ○ |
| | Thickness: 300 μm | ○ | ○ | ○ | ○ |
| Viscosity: 5 Pa·s | Thickness: 1,000 μm | ○ | ○ | ○ | ○ |
| | Thickness: 500 μm | ○ | ○ | ○ | ○ |
| | Thickness: 300 μm | ○ | ○ | ○ | ○ |
| Viscosity: 0.5 Pa·s | Thickness: 1,000 μm | ○ | ○ | ○ | ○ |
| | Thickness: 500 μm | ○ | ○ | ○ | ○ |
| | Thickness: 300 μm | ○ | ○ | ○ | ○ |

Three semiconductor devices were evaluated in each type of evaluations. In Table 2, in the partial discharge measurement, "○" is noted for items in which all three semiconductor devices passed the test, "Δ" is noted for items in which one or two semiconductor devices passed the test, and "x" is noted for items in which no semiconductor device passed the test.

The test results shown in Table 2 are described. In the sample having the viscosity of the silicone rubber of 80 Pa·s, it has been found that, when the creepage distance is 1.5 mm or more, the partial discharge characteristic is decreased. Further, it has been found that the partial discharge characteristic is decreased as the thickness of a portion below the substrate is decreased. The reason is considered to be because the silicone rubber was not able to be fully injected to the lower portion of the insulating substrate, which is considered to be affected by the filling performance into a portion having a small electrode pattern thickness and a long creepage distance, that is, the narrow gap region.

A similar tendency was observed also in the sample having the viscosity of the silicone rubber of 40 Pa·s, and it has been found that the partial discharge characteristic is decreased when the creepage distance is 2 mm or more. In the sample having the viscosity of the silicone rubber of 20 Pa·s, it has been found that, even when a narrow gap region having the creepage distance of 2 mm or more and the electrode pattern thickness of 300 μm is was formed, a sufficient partial discharge characteristic is exhibited.

In the samples having the viscosities of the silicone rubber of 20 Pa·s, 5 Pa·s, and 0.5 Pa·s, it has been found that, regardless of the creepage distance and the electrode pattern thickness, a satisfactory partial discharge characteristic is exhibited within a range evaluated this time.

From the above-mentioned results, it has been found that, in a semiconductor device having a narrow gap region in which the creepage distance of the insulating substrate of the semiconductor device is 1 mm or more and the filling height of the silicone rubber below the surface portion is 1 mm or less, a high partial discharge characteristic can maintained when the viscosity of the silicone rubber to be injected into the narrow gap is 20 Pa·s or less.

REFERENCE SIGNS LIST 1 base plate,
2 case member,
3 bonding material,
4 semiconductor element,
5 insulating circuit board,
6 bonding wire,
7 electrode terminal,
8 lid member,
9 silicone gel,
10 silicone rubber,
11 partition wall,
51, 53 electrode pattern,
52 insulating substrate,
111 arrangement region,
100, 200, 300, 400, 2002 semiconductor device,
1000 power supply,
2000 electric power converter,
2001 main conversion circuit,
2003 control circuit,
3000 load.

The invention claimed is:

1. A semiconductor device, comprising:
an insulating substrate having a conductor layer formed on each of an upper face and a lower face of the insulating substrate, the conductor layer on the upper face including a plurality of conductor layers in a plurality of areas, at least one of the plurality of conductor layers on the upper face having a semiconductor element mounted thereon;
a base plate bonded to the conductor layer on the lower face;
a case member surrounding the insulating substrate and adhering to a surface of the base plate to which the conductor layer on the lower face is bonded;
a first filler being a silicone composition injected into a region surrounded by the base plate and the case member; and
a second filler being a silicone composition that is harder than the first filler, the second filler being injected into a region surrounding a peripheral edge portion of the insulating substrate and a region between the plurality of conductor layers so as to cover an entirety of the upper face of the insulating substrate in the region between the plurality of conductor layers, the second filler being injected into a region below the first filler, the second filler being injected into a region in which a height from the base plate is higher than the upper face and is lower than a bonding face between the semiconductor element and the conductor layer on the upper face.

2. The semiconductor device according to claim 1, wherein the second filler has a viscosity in a range from 0.5 Pa·s to 20 Pa·s.

3. The semiconductor device according to claim 1,
wherein a creepage distance of the insulating substrate exposed from the conductor layer is 1 mm or more, and
wherein a distance from the base plate to a surface portion of a lower face of the insulating substrate, which is filled with the second filler, is in a range from 0.3 mm to 1 mm.

4. The semiconductor device according to claim 1, wherein an interval between the case member and the insulating substrate is in a range from 2 mm to 10 mm.

5. The semiconductor device according to claim 1, wherein the second filler has a hardness in a range from 10 to 70 in Shore A hardness.

6. The semiconductor device according to claim 1, wherein the first filler has a hardness in a range from 20 to 100 in penetration.

7. The semiconductor device according to claim 1, wherein the insulating substrate includes a plurality of insulating substrates bonded on the base plate.

8. The semiconductor device according to claim 7, wherein an interval between the plurality of insulating substrates bonded on the base plate is in a range from 2 mm to 10 mm.

9. The semiconductor device according to claim 1,
wherein the first filler includes a silicone gel, and
wherein the second filler includes a silicone rubber.

10. An electric power converter, comprising:
a main conversion circuit including the semiconductor device of claim 1 and configured to convert power input to the main conversion circuit to output power obtained by the conversion; and
a control circuit configured to output a control signal for controlling the main conversion circuit to the main conversion circuit.

11. A semiconductor device, comprising:
an insulating substrate having a conductor layer formed on each of an upper face and a lower face of the insulating substrate, the conductor layer on the upper face having a semiconductor element mounted thereon;
a base plate bonded to the conductor layer on the lower face;
a case member surrounding the insulating substrate and adhering to a surface of the base plate to which the conductor layer on the lower face is bonded;
a first filler being a silicone composition injected into a region surrounded by the base plate and the case member;
a second filler being a silicone composition that is harder than the first filler, the second filler surrounding a peripheral edge portion of the insulating substrate below the first filler in the region, the second filler being injected into a region in which a height from the base plate is higher than the upper face and is lower than a bonding face between the semiconductor element and the conductor layer on the upper face; and
a partition wall formed around an entire outer periphery of the insulating substrate, an inside of the partition wall being filled with the second filler.

12. The semiconductor device according to claim 11, wherein a distance from an end portion of the insulating substrate to the partition wall is smaller than an interval between the case member and the insulating substrate, and is in a range of 2 mm or more and less than 10 mm.

13. The semiconductor device according to claim 11, wherein the second filler has a viscosity in a range from 0.5 Pa·s to 20 Pa·s.

14. The semiconductor device according to claim 11,
wherein a creepage distance of the insulating substrate exposed from the conductor layer is 1 mm or more, and
wherein a distance from the base plate to a surface portion of a lower face of the insulating substrate, which is filled with the second filler, is in a range from 0.3 mm to 1 mm.

15. The semiconductor device according to claim 11, wherein an interval between the case member and the insulating substrate is in a range from 2 mm to 10 mm.

16. The semiconductor device according to claim 11, wherein the second filler has a hardness in a range from 10 to 70 in Shore A hardness.

17. The semiconductor device according to claim 11, wherein the first filler has a hardness in a range from 20 to 100 in penetration.

18. The semiconductor device according to claim 17, wherein an interval between the plurality of insulating substrates bonded on the base plate is in a range from 2 mm to 10 mm.

19. The semiconductor device according to claim 11, wherein the insulating substrate includes a plurality of insulating substrates bonded on the base plate.

20. The semiconductor device according to claim 11,
wherein the first filler includes a silicone gel, and
wherein the second filler includes a silicone rubber.

* * * * *